United States Patent
Hu et al.

(10) Patent No.: US 9,623,951 B2
(45) Date of Patent: Apr. 18, 2017

(54) HEATING ELEMENTS FOR AIRCRAFT HEATED FLOOR PANELS

(71) Applicant: Goodrich Corporation, Charlotte, NC (US)

(72) Inventors: Jin Hu, Hudson, OH (US); Richard R. Hamm, Akron, OH (US); Kevin E. Roach, Stow, OH (US)

(73) Assignee: Goodrich Corporation, Charlotte, NC (US)

( * ) Notice: Subject to any disclaimer, the term of this patent is extended or adjusted under 35 U.S.C. 154(b) by 395 days.

(21) Appl. No.: 14/179,281

(22) Filed: Feb. 12, 2014

(65) Prior Publication Data

US 2015/0053662 A1    Feb. 26, 2015

Related U.S. Application Data

(60) Provisional application No. 61/891,292, filed on Oct. 15, 2013, provisional application No. 61/891,276, (Continued)

(51) Int. Cl.
   *B60L 1/02*    (2006.01)
   *B64C 1/18*    (2006.01)
   (Continued)

(52) U.S. Cl.
   CPC ................ *B64C 1/18* (2013.01); *B64D 13/00* (2013.01); *F24D 13/024* (2013.01); *H05B 3/16* (2013.01);
   (Continued)

(58) Field of Classification Search
   CPC .............. Y02B 30/26; H05B 2203/003; H05B 2203/013; H05B 2203/017; H05B 3/16;
   (Continued)

(56) References Cited

U.S. PATENT DOCUMENTS 2,021,491 A    11/1935    Ruben
4,606,116 A    8/1986    Hennings et al.
(Continued)

FOREIGN PATENT DOCUMENTS

DE        3919974 A1    12/1989
DE    102011084303 A1    4/2013
(Continued)

OTHER PUBLICATIONS

Extended European Search Report dated Feb. 9, 2016, issued on European Patent Application No. 14189058.2, 8 pages.
(Continued)

*Primary Examiner* — Shawntina Fuqua
(74) *Attorney, Agent, or Firm* — Locke Lord LLP; Scott D. Wofsy; Alicia J. Carroll

(57) ABSTRACT

A method of forming a heating element includes depositing a conductive ink of silver particles in an epoxy resin on a dielectric film to create a conductive circuit, and heat curing the conductive circuit to achieve a resistivity of the heating element less than $1.68 \times 10^{-6}$ ohm·meter. An aircraft heated floor panel includes at least one floor panel of an aircraft includes a conductive circuit positioned within the floor panel having a conductive ink of silver particles in an epoxy resin on a dielectric film.

10 Claims, 1 Drawing Sheet

Related U.S. Application Data filed on Oct. 15, 2013, provisional application No. 61/868,372, filed on Aug. 21, 2013.

(51) Int. Cl.

| | |
|---|---|
| *B64D 13/00* | (2006.01) |
| *F24D 13/02* | (2006.01) |
| *H05B 3/16* | (2006.01) |
| *H05K 3/38* | (2006.01) |
| *H05B 3/26* | (2006.01) |
| *H05K 3/12* | (2006.01) |
| *H05K 1/16* | (2006.01) |

(52) U.S. Cl.
CPC ............ *H05B 3/26* (2013.01); *H05K 3/1283* (2013.01); *H05K 3/38* (2013.01); *F24D 2200/08* (2013.01); *F24D 2220/2081* (2013.01); *H05B 2203/003* (2013.01); *H05B 2203/013* (2013.01); *H05B 2203/017* (2013.01); *H05K 1/167* (2013.01); *H05K 3/1216* (2013.01); *H05K 2201/09263* (2013.01); *Y02B 30/26* (2013.01); *Y10T 29/49155* (2015.01); *Y10T 29/49162* (2015.01)

(58) Field of Classification Search
CPC ................. H05B 3/26; Y10T 29/49155; Y10T 29/49162; F24D 13/024; F24D 2200/08; F24D 2220/2081; H05K 2201/09263; H05K 3/1216; H05K 3/1283; H05K 3/38; H05K 1/167; B64C 1/18; B64D 13/00

See application file for complete search history.

(56) References Cited

U.S. PATENT DOCUMENTS

| | | |
|---|---|---|
| 4,864,482 A | 9/1989 | Quazi et al. |
| 6,297,979 B1 | 10/2001 | Tse |
| 6,834,159 B1 * | 12/2004 | Schramm ................ B32B 15/04 |
| | | 219/213 |
| 7,266,000 B2 | 9/2007 | Terdan |
| 7,556,221 B2 | 7/2009 | Hindel et al. |
| 7,557,330 B2 | 7/2009 | Shearer |
| 7,763,833 B2 | 7/2010 | Hindel et al. |
| 8,071,888 B2 | 12/2011 | Shiraishi et al. |
| 8,507,831 B2 * | 8/2013 | Howick ............... B60N 2/5678 |
| | | 219/210 |
| 2010/0065686 A1 | 3/2010 | Tauscher et al. |

FOREIGN PATENT DOCUMENTS

| | | |
|---|---|---|
| EP | 0065419 A1 | 11/1982 |
| EP | 0347824 A2 | 12/1989 |
| EP | 2113456 A2 | 11/2009 |
| FI | WO 2011/151516 | 12/2011 |
| GB | WO 91/09511 | 6/1991 |
| WO | WO-03/001849 A2 | 1/2003 |
| WO | WO 2009/117408 | 9/2009 |

OTHER PUBLICATIONS

Pique A., et al., "Embedding Electronic Circuits by Laser Direct-Write", Microelectronic Engineering, vol. 83, No. 11-12, Nov. 1, 2006, pp. 2527-2533.

Extended European Search Report dated Feb. 9, 2016, issued on corresponding European Patent Application No. 14188982.4 (9 pages).

* cited by examiner

HEATING ELEMENTS FOR AIRCRAFT HEATED FLOOR PANELS

CROSS-REFERENCE TO RELATED APPLICATIONS

This application claims priority to U.S. Provisional Patent Application No. 61/868,372, filed Aug. 21, 2013, to U.S. Provisional Patent Application No. 61/891,276 filed Oct. 15, 2013, and to U.S. Provisional Patent Application No. 61/891,292 filed Oct. 15, 2013, all of which are incorporated by reference herein in their entirety.

BACKGROUND OF THE INVENTION

1. Field of the Invention

The present disclosure relates to heating circuits, and more particularly to resin-based conductive ink circuits.

2. Description of Related Art

Traditionally, resistive heating elements of heated floor panels are chemically etched alloy elements. The etch process is fairly involved and requires multiple steps. While satisfactory for its intended purpose the traditional etch process can be time consuming, cause manufacturing difficulties and delay due to over- or under-etch (making resistance too high or too low) or defects due to the photo-print process, and can lead to failure due to mechanical fatigue in the field.

Such conventional methods and systems have generally been considered satisfactory for their intended purpose. However, there is still a need in the art for methods and systems that allow for improved ease of manufacture and mechanical strength while still maintaining the required resistivity. The present disclosure provides a solution for these problems.

SUMMARY OF THE INVENTION

A method of forming a heating element includes depositing a conductive ink of silver particles in an epoxy resin on a dielectric film to create a conductive circuit, and temperature heat curing the conductive circuit to achieve a resistivity of the heating element less than $1.68 \times 10^{-6}$ ohm·meter.

It is contemplated that the step of heat curing can include curing at a temperature between 155° C.-200° C., and/or at a temperature between a glass transition temperature of the conductive ink and a maximum thermal stability temperature of the conductive ink. The glass transition temperature can be lower than the maximum thermal stability temperature and the maximum thermal stability temperature can be greater than 155° C. For example, the maximum thermal stability temperature of the conductive ink can exceed 200° C. Further, the silver loading can be between 65%-95% weight/weight of dry ink. For example, in certain applications, the silver loading can be between 75%-89% weight/weight of dry ink. The step of depositing can include screen printing the conductive ink onto the dielectric film, and/or can include depositing the conductive ink in a patterned layer. In addition, the step of curing can include post-curing at a temperature of at least 200° C., and/or can include heat curing at predetermined time intervals. The method can also include applying the conductive circuit to at least one panel skin of an aircraft floor panel. Further, the conductive ink is configured such that a 0.002 inch (50.8 microns) to 0.004 inch (101.6 microns) thick post-cure layer of the conductive ink can achieve the resistivity of the heating element and be bent around a ¼ inch (0.635 cm) diameter cylinder rod without experiencing electric resistance degradation. It is also contemplated that the cylinder rod could have a ⅛ inch (0.3175 cm) diameter, or lower.

In accordance with certain embodiments, at least one floor panel of an aircraft includes a heating element with a conductive circuit positioned within the floor panel. The conductive circuit includes a conductive ink of silver particles in an epoxy resin on a dielectric film.

It is also contemplated that the conductive ink can be disposed onto the dielectric film in patterned layers. Further, the silver loading, curing and post-curing temperatures, and resistivity of the heating element can be much as described above.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
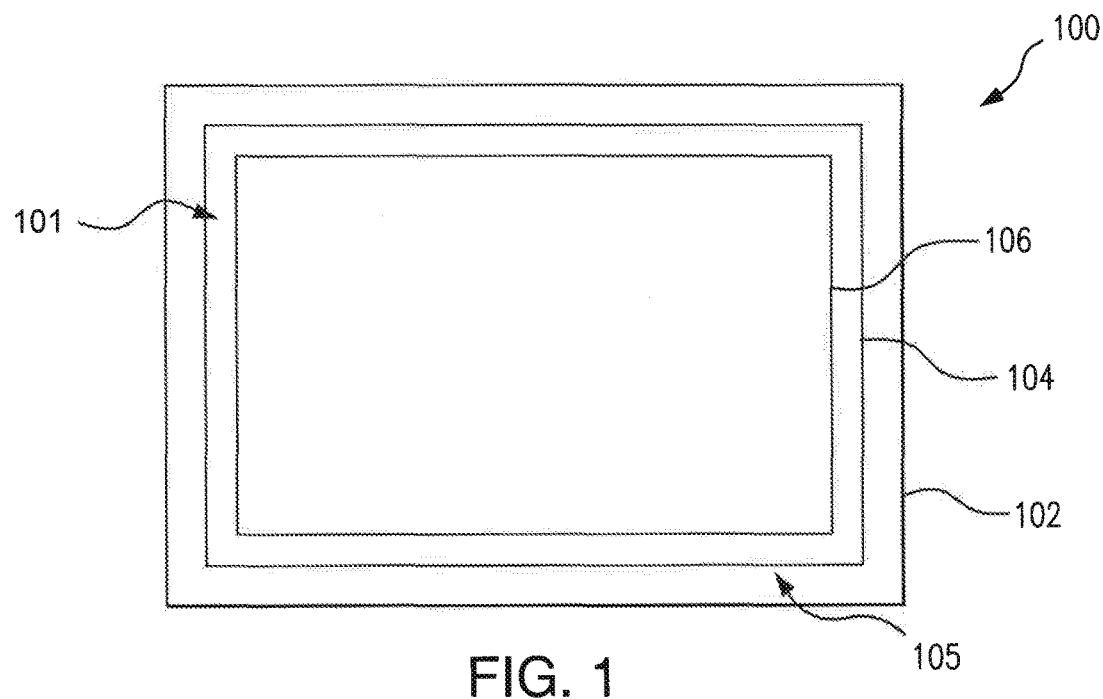
FIG. 1 is a top plan view of an exemplary embodiment of an aircraft heated floor panel constructed in accordance with the present disclosure, schematically showing the conductive circuit with conductive ink of silver particles in an epoxy resin on a dielectric film.

Reference will now be made to the drawings wherein like reference numerals identify similar structural features or aspects of the subject disclosure. For purposes of explanation and illustration, and not limitation, an exemplary embodiment of an aircraft heated floor panel in accordance with the disclosure is shown in FIG. 1 and is designated generally by reference character 100. Other embodiments of the aircraft heated floor panel in accordance with the disclosure, or aspects thereof, are provided in FIG. 2, as will be described. The systems and methods described herein can be used heating elements of heated floor panels, and/or other aircraft electrothermal heaters including ice protection systems for high power density, high temperature applications.

Screen printed resin-based conductive ink heating elements tend to be easier to manufacture than traditional chemically etched alloy resistive heating elements. Screen printed resin-based conductive inks, however, can require low resistivity of the heating elements, for example $1.68 \times 10^{-6}$ ohm·meter or lower. Those skilled in the art will readily appreciate that high metal particle loading of the conductive ink can achieve such low resistivity, but there may be a trade-off of reduced mechanical strength.

As show in FIG. 1, an aircraft heated floor panel 100 includes at least one floor panel 102 of an aircraft and a heating element 105 including a conductive circuit 101 positioned within floor panel 102. Conductive circuit 101 includes a conductive ink 106 of silver nano-particles in an epoxy resin on a dielectric film 104. While shown schematically as a rectangle, those skilled in the art will readily appreciate that conductive ink 106 can be disposed onto dielectric film 104 in a variety of patterned layers, e.g. by screen printing. Those skilled in the art will readily appreciate that multiple screen printed thin layers of conductive ink 106 allow for laterally aligned platelet or needle shape silver particles which tend to cause low electric resistivity.

Those skilled in the art will readily appreciate that, the silver loading can be between 65%-95% weight/weight of dry ink. For example, in certain applications, the silver loading can be between 75%-89% weight/weight of dry ink. Further those skilled in the art will readily appreciate that conductive circuit 101 can be post-cured at a temperature of 200° C., can be post-cured at a temperature between a glass transition temperature of the conductive ink and a maximum thermal stability temperature of the conductive ink, and/or the resistivity of heating element 105 can be less than $1.68 \times 10^{-6}$ ohm·meter. Those skilled in the art will readily appreciate that the maximum thermal stability temperature of the conductive ink can vary as is suitable for a given conductive ink used. In addition, those skilled in the art will readily appreciate that the glass transition temperature can be lower than the maximum thermal stability temperature and the maximum thermal stability temperature can be greater than 155° C. For example, the maximum thermal stability temperature of the conductive ink can exceed 200° C.

Figure 2:
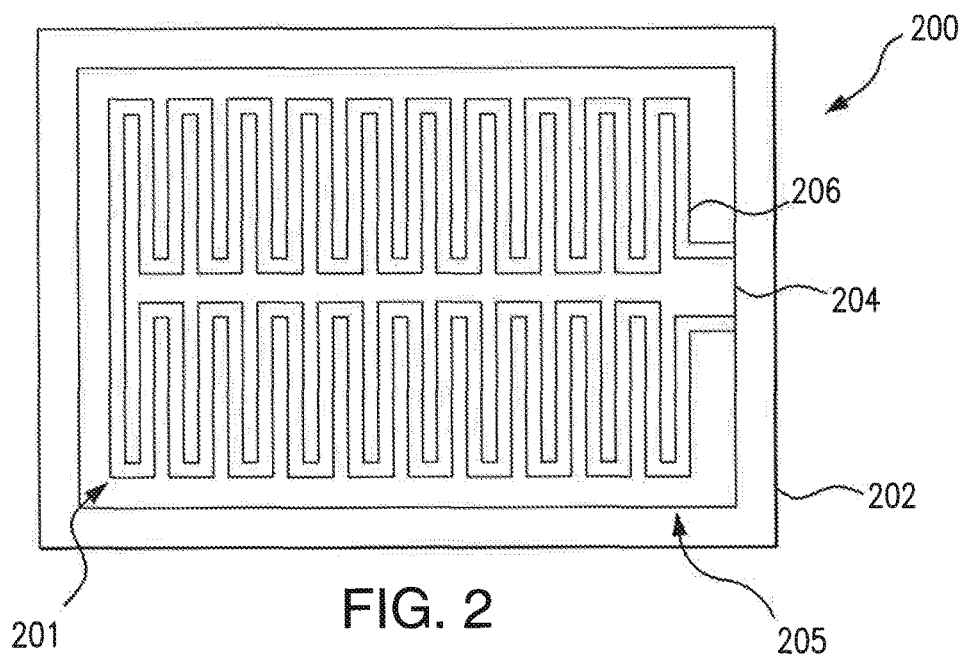
FIG. 2 is a top plan view of an exemplary embodiment view of an aircraft heated floor panel constructed in accordance with the present disclosure, schematically showing the conductive circuit with conductive ink of silver particles in an epoxy resin disposed onto a dielectric film in a patterned layer.

As show in FIG. 2, an aircraft heated floor panel 200 includes at least one floor panel 202 of an aircraft and a heating element 205 including a conductive circuit 201 positioned within floor panel 202. Conductive circuit 201 includes a conductive ink 206 of silver particles in an epoxy resin on a dielectric film 204, substantially similar to aircraft heated floor panel 100 as described above. In FIG. 2, however, conductive ink 206 is disposed onto dielectric film 204 in a patterned layer. Those skilled in the art will readily appreciate that, the high silver loading of the conductive ink, post-curing temperatures, and resistivity of heating element, with respect to aircraft heated floor panel 200, can all be similar to those described above with respect to aircraft heated floor panel 100.

With reference now to FIGS. 1 and 2, a method of forming a heating element, e.g. heating element 105 or 205, for an aircraft heated floor panel, e.g. aircraft heated floor panel 100 or 200 includes depositing a conductive ink, e.g. conductive ink 106 or 206, of silver particles in an epoxy resin on a dielectric film, e.g. dielectric film 104 or 204, to create a conductive circuit, e.g. conductive circuit 101 or 201. The conductive circuit is heat cured at a high temperature to achieve a resistivity of the heating element less than $1.68 \times 10^{-6}$ ohm·meter. The method of forming the heating element for the aircraft heated floor panel includes applying the conductive circuit to at least one panel skin of an aircraft floor panel, e.g. aircraft floor panel 101 or 202.

Those skilled in the art will readily appreciate that depositing the conductive ink includes depositing a patterned layer of the conductive ink, as shown in FIG. 2. Those skilled in the art will readily appreciate that the step of heat curing can include curing at a temperature between 155° C.-200° C., and/or between a glass transition temperature of the conductive ink and a maximum thermal stability temperature of the conductive ink. In other words, for example, the step of heat curing can include curing at a temperature greater than 200° C. depending on the thermal stability temperature of the conductive ink used.

Those skilled in the art will further readily appreciate that the silver loading can be between 65%-95% weight/weight of dry ink, and/or the step of depositing can include screen printing the conductive ink onto the dielectric film. For example, in certain applications, the silver loading can be between 75%-89% weight/weight of dry ink. In addition, those skilled in the art will readily appreciate that the step of curing can include post-curing at a temperature of at least 200° C., and/or can include heat curing at predetermined time intervals.

Those skilled in the art will readily appreciate that with the high silver loading, high temperature post curing, and the appropriate cure time intervals, as described above, various low resistivity numbers between those of Inconel® 600 ½ hard ($1.680 \times 10^{-6}$ ohm·meter), available from Special Metals Corporation, Huntington, W. Va., and those of stainless steel, e.g. SS 302-2B ($7.198 \times 10^{-7}$ ohm·meter), or even resistivity numbers as low as those of Monel® 401 ($5.07 \times 10^{-7}$ ohm·meter), also available from Special Metals Corporation, can be achieved for conductive ink, e.g. conductive ink 106.

Those skilled in the art will also readily appreciate that conductive ink, e.g. conductive ink 106, can achieve the resistivity described above without sacrificing mechanical strength and durability. For example, a 0.002 inch (50.8 microns) to 0.004 inch (101.6 microns) thick post-cure layer of conductive ink 106 is configured to be bent around a ¼ inch (0.635 cm) diameter cylinder rod without experiencing electric resistance degradation. It is also contemplated that cylinder rod can be a ⅛ inch (0.3175 cm) in diameter, or lower.

The methods and systems of the present disclosure, as described above and shown in the drawings, provide for an aircraft heated floor panel with superior properties including reduced rework, scrap and defects, reduced labor and chemical disposal costs and better fatigue resistance than traditional heated floor panels. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method of forming a heating element, the method comprising:
   depositing a conductive ink of silver particles in an epoxy resin on a dielectric film to create a conductive circuit; and
   heat curing the conductive circuit to achieve a resistivity of the heating element less than $1.68 \times 10^{-6}$ ohm·meter, wherein a 0.001 inch (50.8 microns) to 0.004 inch (101.6 microns) thick post-cure layer of the conductive ink is configured to achieve the resistivity of the heating element and be bent around a ¼ inch (0.635 cm) diameter cylinder rod without experiencing electric resistance degradation, wherein the silver loading is between 65%-95% weight/weight of dry ink.

2. A method as recited in claim 1, wherein the step of heat curing includes curing at a temperature between 155° C.-200° C.

3. A method as recited in claim 1, wherein the step of heat curing includes curing at a temperature between a glass transition temperature of the conductive ink and a maximum thermal stability temperature of the conductive ink, wherein the glass transition temperature is lower than the maximum thermal stability temperature and the maximum thermal stability temperature is greater than 155° C.

4. A method as recited in claim 1, wherein the step of depositing includes screen printing the conductive ink onto the dielectric film.

5. A method as recited in claim 1, wherein the step of depositing includes depositing a patterned layer of the conductive ink.

6. A method as recited in claim 1, further including applying the conductive circuit to at least one panel skin of an aircraft floor panel.

7. An aircraft heated floor panel comprising:
at least one floor panel of an aircraft includes a heating element with a conductive circuit positioned within the floor panel, wherein the conductive circuit includes a conductive ink of silver particles in an epoxy resin on a dielectric film, wherein the resistivity of the heating element is less than $1.68 \times 10^{-6}$ ohm·meter, wherein a 0.001 inch (50.8 microns) to 0.004 inch (101.6 microns) thick post-cure layer of the conductive ink is configured to achieve the resistivity of the heating element and be bent around a ¼ inch (0.635 cm) diameter cylinder rod without experiencing electric resistance degradation, wherein the silver loading is between 65%-95% weight/weight of dry ink.

8. An aircraft heated floor panel as recited in claim 7, wherein the conductive ink is disposed onto the dielectric film in a patterned layer.

9. An aircraft heated floor panel as recited in claim 7, wherein the conductive circuit is post-cured at a temperature between a glass transition temperature of the conductive ink and a maximum thermal stability temperature of the conductive ink, wherein the glass transition temperature is lower than the maximum thermal stability temperature and the maximum thermal stability temperature is greater than 155° C.

10. An aircraft heated floor panel as recited in claim 7, wherein the conductive circuit is post-cured at a temperature between 155° C. and 200° C.

\* \* \* \* \*